United States Patent
Kondo et al.

(10) Patent No.: US 11,120,849 B2
(45) Date of Patent: *Sep. 14, 2021

(54) SEMICONDUCTOR LAYERED DEVICE WITH DATA BUS

(71) Applicant: Micron Technology, Inc., Boise, ID (US)

(72) Inventors: Chikara Kondo, Hachioji (JP); Chiaki Dono, Chigasaki (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/459,439

(22) Filed: Jul. 1, 2019

(65) Prior Publication Data

US 2019/0325926 A1  Oct. 24, 2019

Related U.S. Application Data

(63) Continuation of application No. 15/233,821, filed on Aug. 10, 2016, now Pat. No. 10,373,657.

(51) Int. Cl.
*G11C 7/10* (2006.01)
*G11C 5/02* (2006.01)
(Continued)

(52) U.S. Cl.
CPC ........ *G11C 7/1006* (2013.01); *G06F 13/4282* (2013.01); *G11C 5/025* (2013.01);
(Continued)

(58) Field of Classification Search
CPC ... G11C 7/1006; G11C 7/1066; G11C 7/1093; G11C 7/222; G06F 13/4282; Y02D 10/00
(Continued)

(56) References Cited

U.S. PATENT DOCUMENTS 8,930,647 B1 * 1/2015 Smith ................. G06F 30/392
711/154
9,091,727 B1   7/2015 Lupu et al.
(Continued)

FOREIGN PATENT DOCUMENTS

JP       2015207333 A    11/2015
KR  10-2015-0025764 A    3/2015
(Continued)

OTHER PUBLICATIONS

International Preliminary Report on Patentability dated Feb. 12, 2019, 10 pages.
(Continued)

*Primary Examiner* — Henry Tsai
*Assistant Examiner* — Aurangzeb Hassan
(74) *Attorney, Agent, or Firm* — Dorsey & Whitney LLP

(57) ABSTRACT

Apparatuses and methods of data communication between semiconductor chips are described. An example apparatus includes: a first semiconductor chip and a second semiconductor chips that are stacked with each other via through substrate vias (TSVs) provided in one of the first semiconductor chip and the second semiconductor chip. The first semiconductor chip and the second semiconductor chips communicate with each other by use of data bus inversion data that have been encoded using a DBI algorithm.

18 Claims, 9 Drawing Sheets

(51) Int. Cl.
*G11C 5/06* (2006.01)
*G11C 7/22* (2006.01)
*G06F 13/42* (2006.01)

(52) U.S. Cl.
CPC ............ *G11C 5/066* (2013.01); *G11C 7/1066* (2013.01); *G11C 7/1093* (2013.01); *G11C 7/222* (2013.01); *Y02D 10/00* (2018.01)

(58) Field of Classification Search
USPC ........................................................ 713/313
See application file for complete search history.

(56) References Cited

U.S. PATENT DOCUMENTS

| | | | |
|---|---|---|---|
| 9,432,298 B1* | 8/2016 | Smith | H04L 49/9057 |
| 2007/0038789 A1* | 2/2007 | Macri | H03L 7/07 |
| | | | 710/105 |
| 2009/0182918 A1 | 7/2009 | Hollis | |
| 2009/0212642 A1 | 8/2009 | Krah | |
| 2010/0199017 A1* | 8/2010 | Hollis | G06F 13/4022 |
| | | | 710/316 |
| 2012/0131244 A1 | 5/2012 | Abbasfar | |
| 2014/0281075 A1* | 9/2014 | Hollis | H04L 7/04 |
| | | | 710/106 |
| 2014/0289440 A1 | 9/2014 | Shu | |
| 2015/0229325 A1* | 8/2015 | Hollis | G06F 13/4221 |
| | | | 710/106 |
| 2015/0231860 A1 | 8/2015 | Yanke et al. | |
| 2015/0269979 A1 | 9/2015 | Byeon | |
| 2015/0355232 A1* | 12/2015 | Whetsei | B05C 21/00 |
| | | | 324/756.05 |
| 2016/0147481 A1* | 5/2016 | Best | G06F 3/0656 |
| | | | 711/105 |
| 2016/0173134 A1* | 6/2016 | Kwon | G06F 13/4265 |
| | | | 714/777 |
| 2016/0188523 A1 | 6/2016 | Teoh et al. | |
| 2016/0196857 A1 | 7/2016 | Lee | |
| 2016/0283429 A1* | 9/2016 | Wagh | G06F 13/4022 |
| 2017/0031853 A1* | 2/2017 | Sadowski | G06F 13/362 |
| 2018/0047432 A1 | 2/2018 | Kondo et al. | |
| 2018/0276164 A1* | 9/2018 | Das Sharma | G06F 13/4265 |
| 2019/0066816 A1* | 2/2019 | Dono | G11C 29/36 |

FOREIGN PATENT DOCUMENTS

| | | |
|---|---|---|
| KR | 20150025764 A | 3/2015 |
| KR | 10-2015-0109209 A | 10/2015 |
| WO | 2014193574 A1 | 12/2014 |
| WO | 20180031187 A1 | 2/2018 |

OTHER PUBLICATIONS

International Search Report and Written Opinion for PCT Application No. PCT/US2017/042210, dated Oct. 24, 2017.
Hardee, et al., "A 170GB/s 16Mb Embedded DRAM with Data-Bus", 2008 IEEE International Solid-State Circuits Conference, Session 14 / Embedded & Graphics DRAMs, pp. 272-273, 612.
EESR dated Mar. 4, 2020 for EP Application No. 17839985.3, 8 pgs.
KR Office Action dated Apr. 6, 2020 for KR Application No. 10-2019-7006391, 9 pgs.
English translation of Office Action for KR Application No. 10-2019-7006391, dated Oct. 14, 2020.
English translation of Officce Action for KR Application No. 10-2019-7006391, dated Nov. 24, 2020.
English translation of Office Action for KR Application No. 10-2021-7005373, dated Apr. 9, 2021.
Office Action for EP Application No. 17839985.3, dated Jan. 27, 2021.

* cited by examiner

SEMICONDUCTOR LAYERED DEVICE WITH DATA BUS

CROSS-REFERENCE TO RELATED APPLICATION(S)

This application is a continuation of U.S. application Ser. No. 15/233,821 filed on Aug. 10, 2016, issued as U.S. Pat. No. 10,373,657 on Aug. 6, 2019, which is incorporated herein by reference, in its entirety, for any purpose.

BACKGROUND

High data reliability, high speed of memory access, lower power consumption and reduced chip size are features that are demanded from semiconductor memory. In recent years, three-dimensional (3D) memory devices have been introduced. Some 3D memory devices are formed by stacking chips (e.g., dice) vertically and interconnecting the chips using through substrate vias (TSVs). Benefits of the 3D memory devices include shorter interconnects which reduce circuit delays and power consumption, a large number of vertical vias between layers which allow wide bandwidth buses between functional blocks in different layers, and a considerably smaller footprint. Thus, the 3D memory devices contribute to higher memory access speed, lower power consumption and chip size reduction. Example 3D memory devices include Hybrid Memory Cube (HMC), High Bandwidth Memory (HBM), and a wide-I/O dynamic random access memory (DRAM).

For example, High Bandwidth Memory (HBM) is a type of memory including a high-performance DRAM interface and vertically stacked DRAM. A typical HBM stack of four DRAM chips (e.g., core chips) has two 128-bit channels per chip for a total of eight input/output channels and a width of 1024 bits in total. An interface (IF) chip of the HBM provides an interface with the eight input/output channels, which function independently of each other. In the HBM, data transmission between chips (e.g., between an interface chip and core chips) via through substrate vias (TSV) may cause high power consumption, due to current charge and discharge at the TSVs as capacitors.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
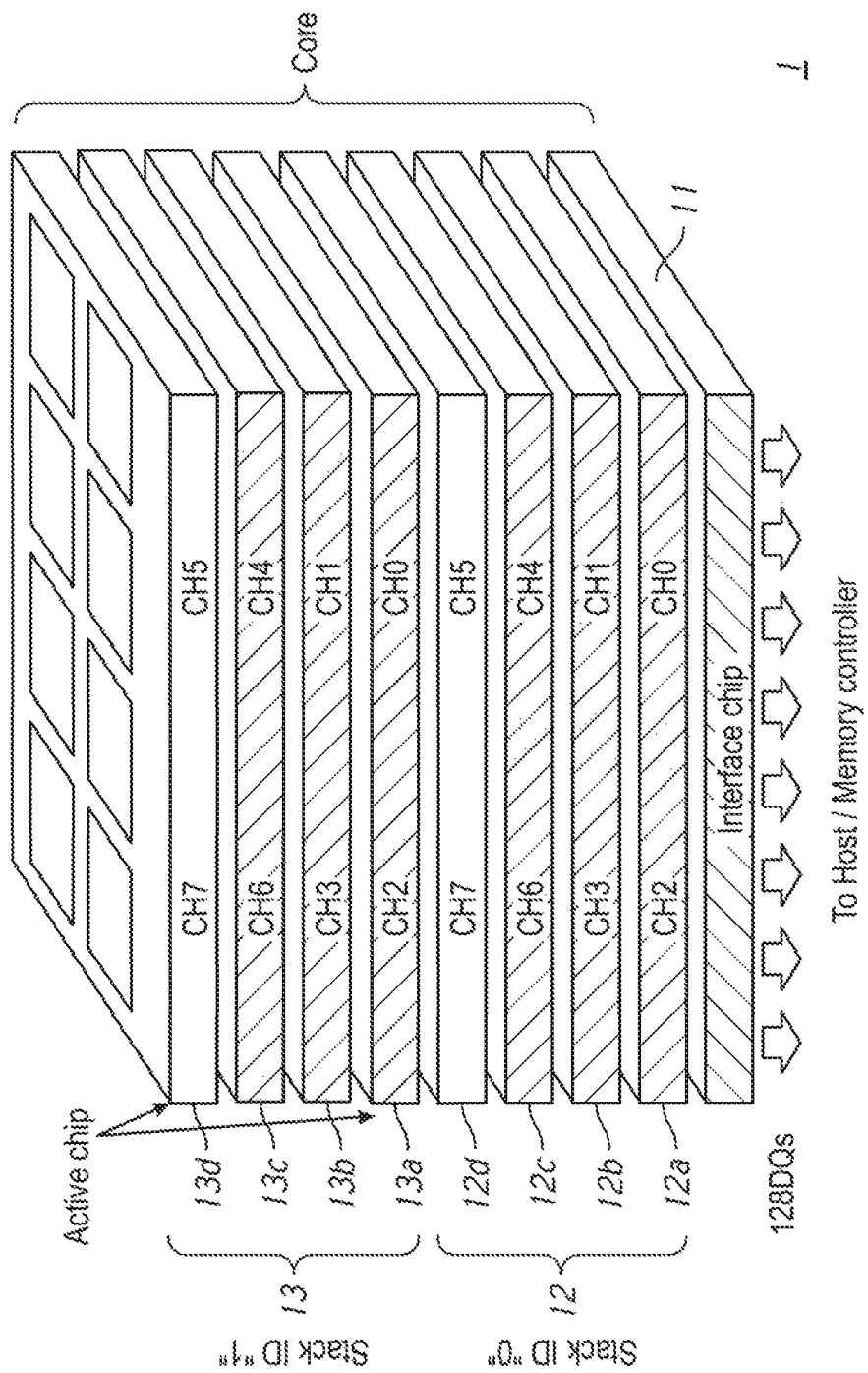
FIG. 1 is a schematic diagram of an interface (IF) chip and a plurality of core chips in a semiconductor device in accordance with an embodiment of the present disclosure.

FIG. 1 is a schematic diagram of an interface (IF) chip and a plurality of core chips in a semiconductor device in accordance with an embodiment of the present disclosure. For example, the semiconductor device 1 may be a 3D memory device, such as an HBM, an HMC, a Wide-IO DRAM etc. The semiconductor device 1 is formed by stacking chips vertically, as shown in FIG. 1. The stacked chips may include two stacks 12 and 13 each assigned with a stack ID "0" and "1", respectively. Each stack 12 and 13 may include core chips 12a to 12d and 13a to 13d, respectively. Each stack has two 128-bit channels per chip for a total of eight input/output channels and a width of 1024 bits in total. An interface (IF) chip 11 of the semiconductor device 1 may provide an interface with the eight input/output channels which function independently of each other between the core chips 12a to 12d and 13a to 13d and a host device that may be a memory controller (not shown) via. The IF chip 11 may couple each channel to the host device via 128 data queues (DQs). In this example, each core chip of the core chips 12a to 12d and 13a to 13d may be a memory chip that includes two channels. The core chips 12a and 13a coupled to channel (CH) 0 and CH2, the core chips 12b and 13b coupled to CH1 and CH3, the core chips 12c and 13c coupled to CH4 and CH6, and the core chips 12d and 13d coupled to CH5 and CH7 may be distinguished by the stack ID while being accessed by a shared channel. For example, when CH5 and CH7 may be accessed, the core chip 12d and the core chip 13d may be active chips for data access. Each channel may include a plurality of memory cells and circuitries accessing the memory cells. For example, the memory cells may be DRAM memory cells. In each core chip, an array stripe for each channel may be activated. For example, array stripes of CH5 and CH7 of the core chip 13d in FIG. 1 may be activated.

In order to reduce power consumption and switching noises in high speed data access on the width of 1024 bits in total, a 3D device may include a data bus inversion ("DBI") system. The DBI system encodes write data using a DBI algorithm and transmits DBI bits indicating whether the write data have been inverted to a memory device chip from a host device. For example, DBI-AC algorithm may compare current data bits with previous data bits and may further minimize a number of data bits that simultaneously transition between the previous data bits and the current data bits by transmitting the data bits after inversion when the number of data bits that simultaneously transition is more than half of the number of the data bits.

Figures 2A, 2B:
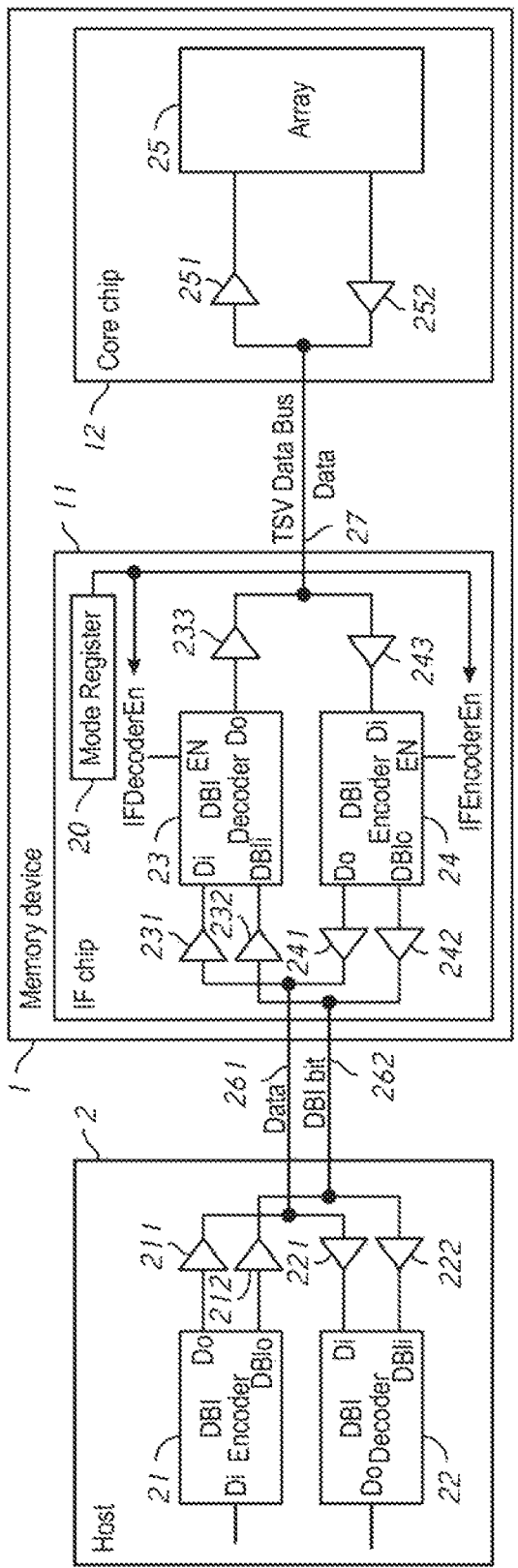
FIG. 2A is a block diagram of a host device and a memory device including an IF chip and a core chip in the semiconductor device in accordance with an embodiment of the present disclosure.
FIG. 2B is a truth table of a mode register setting and enable inputs of the IF chip of FIG. 2A, in accordance with an embodiment of the present disclosure.

FIG. 2A is a block diagram of a host device 2 and a memory device 1 including an IF chip 11 in the semiconductor device in accordance with an embodiment of the present disclosure. The memory device 1 may include the IF chip 11 and a core chip 12 that are stacked with each other. The host device 2 and the memory device 1 may communicate DBI data which has been converted (e.g., encoded, decoded, etc.) using a DBI algorithm. The host device 2 may include a DBI encoder 21. While writing data bits, the DBI encoder 21 may receive current data bits (Dcur) after receiving previous data bits (Dpre) at a data input node (Di). The DBI encoder 21 may encode Dcur with the DBI encoding, when a number of bits that transition in a voltage or logic level (e.g., from a logic high level to a logic low level, or the logic low level to the logic high level) from Dpre to Dcur is more is more than half of the number of the data bits in Dcur. For example, the DBI encoder 21 may provide Dcur as is (e.g., without inversion) to an output buffer 211 coupled to data nodes 261 from a data output node (Do) and may further provide a DBI bit "0" indicative of "no DBI encoding" to an output buffer 212 coupled to a DBI node 262 from a DBI output node (DBIo), if the number of the data bits which transition from Dpre to Dcur is fewer than half of the number of the data bits to be transmitted. The DBI encoder 21 may provide data which are inverted Dcur to the output buffer 211 coupled to the data nodes 261 and may further provide the DBI bit "1" indicative of "DBI encoding" to the output buffer 212 coupled to the DBI node 262, if the number of the data bits which transition from Dpre to Dcur is equal to or more than half of the number of the data bits to be transmitted.

The IF chip 11 in the memory device 1 may include a DBI decoder 23. The DBI decoder 23 may receive the data bits on the data nodes 261 at an input buffer 231 and may further receive the DBI bit on the DBI node 262 at a DBI input buffer 232. The DBI decoder 23 may include a Di node that receives the data bits from the input buffer 231 and a DBI input node (DBIi) node that receives the DBI bit from the DBI input buffer 232. The DBI decoder 23 may be activated by IFDecoderEn signal received at an enable (EN) input of the DBI decoder 23 from a mode register 20. The DBI decoder 23 determines that the data bits are not subject to DBI-encoding and provides the data bits from a Do node to a TSV data bus 27 coupled to the core chip 12 via an output buffer 233, if the IFDecoderEn signal is inactive (e.g., the logic low level). The DBI decoder 23 determines that data is subject to DBI-encoding, if the IFDecoderEn signal is active (e.g., the logic high level). The DBI decoder 23 may further examine if the DBI bit received at the DBIi node is active while the IFDecoderEn signal is active. If the DBI bit is active (e.g., "1") indicative of "DBI encoding", the DBI decoder 23 may provide the data bits at the Di node after data bus inversion from the Do node to an output buffer 233, further coupled to a TSV data bus 27 that is coupled to the core chip 12. If the DBI bit is inactive (e.g., "0"), the DBI decoder 23 may provide the data bits at the Di node on the output buffer 233 from the Do node to the TSV data bus 27 to the core chip 12. The core chip 12 may receive the data from the TSV data bus 27 at an input buffer 251 and the data bits are transmitted to an array 25 that is a memory cell array.

In order to read current data bits from the array 25, the current data bits are provided to the TSV data bus 27 via an output buffer 252. The IF chip 11 in the memory device 1 may include a DBI encoder 24. The DBI encoder 24 may receive the current data bits on the TSV data bus 27 at an input buffer 243. The DBI encoder 24 may include a Di node that receives the current data bits from the input buffer 243. The DBI encoder 24 may be activated by IFEncoderEn signal received at an enable (EN) input of the DBI encoder 24 from the mode register 20. The DBI encoder 24 determines that the current data bits are not subject to DBI-encoding and provides the current data bits from a Do node to the data nodes 261 coupled to the host device 2 via an output buffer 241, if the IFEncoderEn signal is inactive (e.g., the logic low level). The DBI encoder 24 determines that the current data bits are subject to DBI-encoding, if the IFEncoderEn signal is active (e.g., the logic high level). For example, the DBI encoder 24 may provide the current data bits (e.g., without inversion) from the Do node to the output buffer 241 coupled to the data nodes 261 and may further provide a DBI bit "0" indicative of "no DBI encoding" from a DBI output node (DBIo) to an output buffer 242 coupled to the DBI node 262, if the number of the data bits which transition from previous data bits read from the array 25 to the current data bits is fewer than half of the number of the data bits to be transmitted. The DBI encoder 24 may provide data bits which are the current data bits after inversion to the output buffer 242 coupled to the data nodes 261 and further provide the DBI bit "1" indicative of "DBI encoding" to the output buffer 242 coupled to the DBI node 262, if the number of the data bits which transition from the previous data bits to the current data bits is equal to or more than half of the number of the data bits to be transmitted. The host device may include a DBI decoder 22. The DBI decoder 22 may receive the data bits from the data nodes 261 via an input buffer 221 at a data input node (Di) and the DBI bit from the DBI node 262 via an input buffer 222 at a DBI input node (DBIi).

FIG. 2B is a truth table of a mode register setting and enable inputs of the IF chip of FIG. 2A, in accordance with an embodiment of the present disclosure. For example, a mode register 20 may be included in the IF chip 11 in FIG. 2A. The mode register 20 may include a write DBI enable bit (WDBIEn) and a read DBI enable bit (RDBIEn). For example, the IFDecoderEn signal to the enable input of the DBI decoder 23 may be activated (e.g., "1") when the WDBIEn bit is enabled (e.g., "1"). The IFEncoderEn signal to the enable input of the DBI encoder 24 may be activated (e.g., "1") when the RDBIEn bit is enabled (e.g., "1").

Figures 3A, 3B:
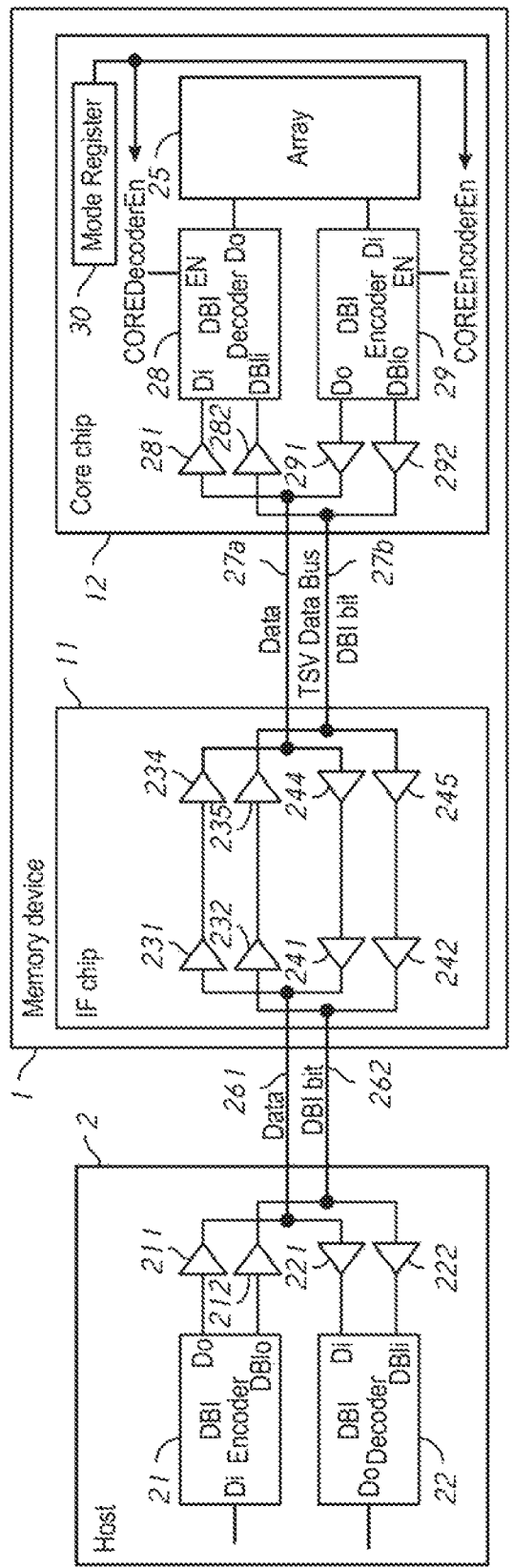
FIG. 3A is a block diagram of a host device and a memory device including an IF chip and a core chip in the semiconductor device in accordance with an embodiment of the present disclosure.
FIG. 3B is a truth table of a mode register setting and enable inputs of the core chip of FIG. 3A, in accordance with an embodiment of the present disclosure.

A DBI system may include a DBI encoder and a DBI decoder in a core chip (e.g., core chips 12 and 13) instead of the IF chip 11. FIG. 3A is a block diagram of a host device 2 and a memory device 1 including an IF chip 11 and a core chip 12 in the semiconductor device in accordance with an embodiment of the present disclosure. Description of components corresponding to the host device 2 in FIG. 2A will not be repeated and changes from FIG. 2A including positional relationships between the components will be described. The memory device 1 may include the IF chip 11 and a core chip 12 that are stacked with each other. The IF chip 11 and the core chip 12 may communicate DBI data which has been converted using a DBI algorithm. The IF chip 11 in the memory device 1 may include an input buffer 231 coupled to data nodes 261 and a DBI input buffer 232 coupled to DBI node 262. The IF chip 11 may receive the data bits on the data nodes 261 at the input buffer 231 and may further receive the DBI bit on the DBI node 262 at the DBI input buffer 232. The IF chip 11 may pass through the data bits to an output buffer 234 and the DBI bit to an output buffer 235. The output buffers 234 and 235 provide the data bits and the DBI bit to TSV data buses 27a and 27b that transmit the data bits and the DBI bits to the core chip 12. The core chip 12 may receive the data bits and the DBI bit at input buffers 281 and 282, respectively. The core chip 12 may further include a DBI decoder 28. The DBI decoder 28 may receive the data bits on the TSV data bus 27a at an input buffer 281 and may further receive the DBI bit on the TSV data bus 27b at an input buffer 282. The DBI decoder 28 may include a Di node that receives the data bits from the input buffer 281 and a DBI input node (DBIi) node that receives the DBI bit from the input buffer 282. The DBI decoder 28 may be activated by COREDecoderEn signal received at an enable (EN) input of the DBI decoder 28 from a mode register 30. The DBI decoder 28 may determine that the data bits are not subject to DBI-encoding and may provide the data bits to the array 25 via a Do node, if the COREDecoderEn signal is inactive (e.g., the logic low level). The DBI decoder 28 may determine that data is subject to DBI-encoding, if the COREDecoderEn signal is active (e.g., the logic high level). The DBI decoder 28 may further examine if the DBI bit received at the DBIi node is active while the IFDecoderEn signal is active. If the DBI bit is active (e.g., "1") indicative of "DBI encoding", the DBI decoder 28 may provide the data bits at the Di node after data bus inversion to the array 25 from the Do node. If the DBI bit is inactive (e.g., "0"), the DBI decoder 28 may provide the data bits at the Di node to the array 25 from the Do node. Thus, the data bits are transmitted to an array 25.

The core chip 12 in the memory device 1 may include a DBI encoder 29. In order to read current data bits from the array 25, the DBI encoder 29 may receive current data bits from the array 25. The DBI encoder 29 may be activated by COREEncoderEn signal received at an enable (EN) input of the DBI encoder 29 from the mode register 30. The DBI encoder 29 determines that the current data bits are not subject to DBI-encoding and provides the current data bits to an output buffer 291 coupled to the IF chip 11 via the TSV data bus 27a from a Do node, if the COREEncoderEn signal is inactive (e.g., the logic low level). The DBI encoder 29 determines that the current data bits are subject to DBI-encoding, if the COREEncoderEn signal is active (e.g., the logic high level). For example, the DBI encoder 29 may provide the current data bits (e.g., without inversion) from the Do node to the output buffer 291 coupled to the TSV data bus 27a and may further provide a DBI bit "0" indicative of "no DBI encoding" from a DBI output node (DBIo) to an output buffer 292 coupled to the TSV data bus 27b, if the number of the data bits which transition from previous data bits read from the array 25 to the current data bits is fewer than half of the number of the data bits to be transmitted. The DBI encoder 29 may provide data bits which are the current data bits after inversion to the output buffer 291 to the TSV data bus 29a and further provide the DBI bit "1" indicative of "DBI encoding" on the output buffer 292 to the TSV data bus 27b, if the number of the data bits which transition from the previous data bits to the current data bits is equal to or more than half of the number of the data bits to be transmitted. The IF chip 11 in the memory device 1 may include an input buffer 244 coupled to the TSV data bus 27a and an input buffer 242 coupled to the TSV data bus 27b. The IF chip 11 may receive the data bits on the TSV data bus 27a at the input buffer 244 and may further receive the DBI bit on the TSV data bus 27b at the input buffer 245. The IF chip 11 may bypass the data bits to an output buffer 241 and the DBI bit to an output buffer 242. The output buffer 241 may be coupled to the data nodes 261 and the output buffer 242 may be coupled to the DBI node 262. Thus, the data bits and the DBI bit may be transmitted from the core chip 12 to the host device 2.

FIG. 3B is a truth table of a mode register setting and enable inputs of the core chip 12 of FIG. 3A, in accordance with an embodiment of the present disclosure. For example, a mode register 30 may be included in the core chip 12 in FIG. 3A. The mode register 30 may include a write DBI enable bit (WDBIEn) and a read DBI enable bit (RDBIEn). For example, the COREDecoderEn signal to the enable input of the DBI decoder 28 may be activated (e.g., "1") when the WDBIEn bit is enabled (e.g., "1"). The COREEncoderEn signal to the enable input of the DBI encoder 29 may be activated (e.g., "1") when the RDBIEn bit is enabled (e.g., "1"). When the enable input of the DBI decoder 28 or the DBI encoder may be inactive (e.g., "0"), the data bus inversion may be disabled on the TSV data bus 27a and 27b.

Figures 4A, 4B:
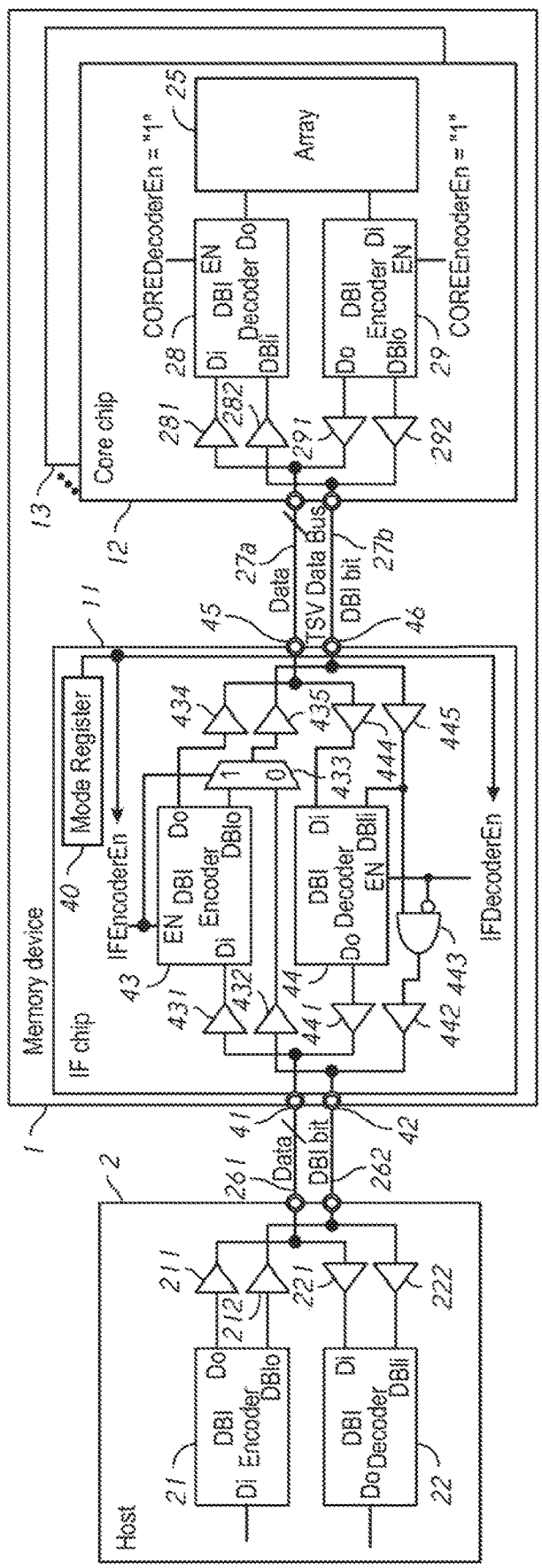
FIG. 4A is a block diagram of a host device and a memory device including an IF chip and a core chip in the semiconductor device in accordance with an embodiment of the present disclosure.
FIG. 4B is a truth table of a mode register setting and enable inputs of the IF chip of FIG. 4A, in accordance with an embodiment of the present disclosure.

A DBI system may include a DBI encoder and a DBI decoder in both of the IF chip 11 and the core chip (e.g., core chips 12 and 13). FIG. 4A is a block diagram of a host device 2 and a memory device 1 including an F chip 11 and a core chip 12 in the semiconductor device in accordance with an embodiment of the present disclosure. Description of components corresponding to the host device 2 in FIG. 4A will not be repeated and changes from FIGS. 2A and 3A including additional components and positional relationships between the components will be described. The IF chip 11 in the memory device 1 may include a DBI encoder 43. The DBI encoder 43 may receive the data bits on the data nodes 261 at input terminals 41 coupled to an input buffer 431. The DBI encoder 43 may include a Di node that receives the data bits from the input buffer 431. The DBI encoder 43 may be activated by IFEncoderEn signal received at an enable (EN) input of the DBI encoder 43. The IF chip 11 may include a mode register 40, which may be set by a "mode register set (MRS)" command from the host device 2, that provides the IFEncoderEn signal to an enable input EN of the DBI encoder 43. The IFEncoderEn signal is indicative of enabling or disabling the DBI encoding by the DBI encoder 43. For example, WDBIEn bit of the mode register 40 being enabled (e.g., "1") indicates that DBI encoding is executed by the DBI encoder 21 in the host device 2 and the mode register 40 may deactivate the IFEncoderEn signal indicating a disable state (e.g., "0") responsive to the enabled WDBIEn bit. For example, the DBI encoder 43 may disable the DBI encoding and may pass through the data bits instead from the Di node to a Do node coupled to an output buffer 434, responsive to the inactive IFEncoderEn signal, due to the enabled WDBIEn bit. For example, WDBIEn bit of the mode register 40 being disabled (e.g., "0") indicates that DBI encoding by the DBI encoder 21 is disabled and the mode register 40 may activate the IFEncoderEn signal indicating an enable state (e.g., "1") responsive to the disabled WDBIEn bit. For example, the DBI encoder 43 may enable the DBI encoding and may perform DBI encoding to generate the DBI encoded data bits, and the provide the DBI encoded data bits to the Do node coupled to the output buffer 434, responsive to the active IFEncoderEn signal, due to the disabled WDBIEn bit. The output buffer 434 may provide the data bits from the Do node of the DBI encoder 43 to output terminals 45. When the DBI encoding is executed, the DBI encoder 43 may generate an active DBI output signal (e.g., "1") and provide the active DBI output signal from a DBIo node, depending on whether actual data bus inversion is executed based a number of data bits that transition. For example, the data bus inversion may be executed and the DBIo signal may be active, if the number of data bits that transition is equal to or more than half of a total number of the data bits. The data bus inversion may not be executed and the DBI output signal may be deactivated, if the number of data bits that transition is fewer than half of the total number of the data bits. A selector circuit 433, such as a multiplexer, may receive the DBI output signal from the DBIo node of the DBI Encoder 43 at an input node "1" and the DBI bit from the DBI node 262 via a DBI input terminal 42 coupled to a DBI input buffer 432 at an input node "0" coupled to the DBI input buffer 432. The multiplexer 433 may receive the IFEncoderEn signal at a selector input. The multiplexer 433 may provide the DBI output signal to an output buffer 435 coupled to a DBI output terminal 46, if the IFEncoderEn signal is "1". The multiplexer 433 may provide the DBI bit from the DBI node 262 to the output buffer 435 coupled to the DBI output terminal 46, if the IFEncoderEn signal is "0". In this manner, DBI encoded data bits and the corresponding DBI bit may be transmitted to the core chips 12 (and 13) via the TSV data buses 27a and 27b. The DBI decoder 28 may receive the active COREDecoderEN signal (e.g., "1"). The active COREDecoderEN signal may be provided by coupling to a positive supply voltage or coupling to a mode register indicating the active COREDecoderEN signal. The DBI encoded data bits may be decoded by the DBI decoder 28 in the core chip 12 and the decoded data bits may be written into the array 25 as described above referring to FIG. 3A. The input terminals 41 and the DBI input terminal 42 are formed on a first surface of the IF chip 11, and the output terminals 45 and the DBI output terminal 46 are formed on a second surface opposite to the first surface of the IF chip 11.

In order to read current data bits from the array 25, the current data bits are provided to the DBI encoder 29. The DBI encoder 29 may receive the active COREEncoderEN signal (e.g., "1"). The active COREEncoderEN signal may be provided by coupling to a positive supply voltage or coupling to a mode register indicating the active COREEncoderEN signal. The DBI encoder 29 may provide the data bits after DBI encoding and a corresponding DBI bit to the TSV data buses 27a and 27b as described above referring to FIG. 3A, responsive to the active COREEncoderEn signal. The IF chip 11 in the memory device 1 may include a DBI decoder 44. The DBI decoder 44 may receive the current data bits from the TSV data bus 27a at an input buffer 444 and the corresponding DBI bit from the TSV data bus 27b at an input buffer 445. The DBI decoder 44 may include a Di node that receives the current data bits from the input buffer 444. The DBI decoder 44 may be activated by IFDecoderEn signal received at an enable (EN) input of the DBI decoder 44. The mode register 40 may provide the IFDecoderEn signal indicative of enabling or disabling the DBI decoding by the DBI decoder 44. For example, RDBIEn bit of the mode register 40 being enabled (e.g., "1") indicates that DBI decoding is executed by the DBI decoder 22 in the host device 2 and the mode register 40 may deactivate the IFDecoderEn signal (e.g., "0") responsive to the enabled RDBIEn bit. For example, the DBI encoder 44 may disable the DBI decoding and may pass through the data bits instead from the Di node to a Do node coupled to an output buffer 441, responsive to the inactive IFDecoderEn signal, due to the enabled RDBIEn bit. Simultaneously, an AND circuit 443 may provide the DBI bit on the TSV data bus 27b via the input buffer 445 to an output buffer 442, responsive to the inactive IFDecoderEn signal. For example, RDBIEn bit of the mode register 40 being disabled (e.g., "0") indicates that DBI decoding by the DBI decoder 22 is disabled and the mode register 40 may activate the IFDecoderEn signal (e.g., "1") responsive to the disabled RDBIEn bit. For example, the DBI decoder 44 may enable the DBI decoding and may perform DBI decoding and provide the DBI decoded data bits to the Do node coupled to an output buffer 441, responsive to the active IFDecoderEn signal, due to the disabled RDBIEn bit. When the DBI decoding is executed, the AND circuit 443 may provide the inactive signal "0" responsive to an inverted signal of the active IFDecoderEn signal. Thus, the output buffer 442 may provide the inactive signal "0" to the DBI node 262 simultaneously with the DBI decoded data bit on the data nodes 261. Thus, the data nodes 261 and the DBI node 262 may provide DBI decoded data bits and a corresponding inactive DBI bit responsive to the disabled RDBIEn bit (e.g., "0"), and the DBI decoder 22 may pass through the data bits. The data nodes 261 and the DBI node 262 may provide DBI encoded data bits and the corresponding DBI bit depending on data inversion status responsive to the enabled RDBIEn bit. Based on the enabled RDBIEn bit (e.g., "1"), the DBI decoder 22 may decode the DBI encoded data bits.

FIG. 4B is a truth table of a mode register setting and enable inputs of the IF chip of FIG. 4A, in accordance with an embodiment of the present disclosure. The mode register 40 may include a write DBI enable bit (WDBIEn) and a read DBI enable bit (RDBIEn). For example, the IFEncoderEn signal to the enable input of the DBI Encoder 43 may be activated (e.g., "1") when the WDBIEn bit is disabled (e.g., "0"). The IFDecoderEn signal to the enable input of the DBI decoder 44 may be activated (e.g., "1") when the RDBIEn bit is disabled (e.g., "0"). As described above, one of the DBI encoder 21 or the DBI encoder 43 may be activated and one of the DBI decoder 22 and the DBI decoder 44 may be activated. Thus, the IFEncoderEn signal may be obtained by a bit inversion of the WDBIEn bit in the mode register 40, and the IFDecoderEN signal may be obtained by a bit inversion of the RDBIEn bit in the mode register 40.

Figure 5:
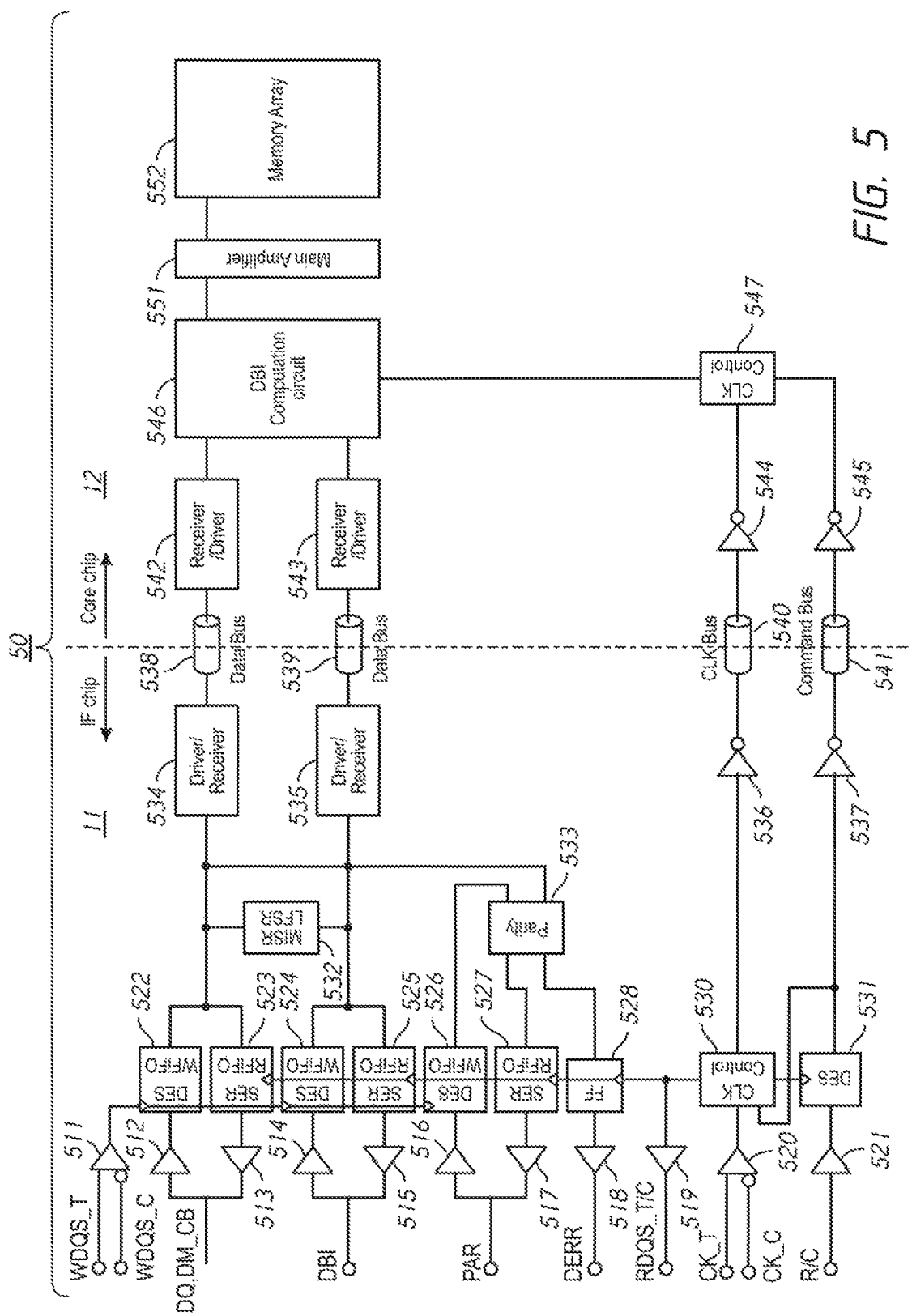
FIG. 5 is a block diagram of a memory device including a DBI computation circuit in accordance with an embodiment of the present disclosure.

FIG. 5 is a block diagram of a memory device including a DBI computation circuit in accordance with an embodiment of the present disclosure. The memory device 50 may include an IF chip 11 and a core chip 12 that may execute the DBI function. The IF chip 11 may receive signals from a host device that may be a memory controller (not shown) and may further transmit signals to the memory controller. For example, the IF chip 11 may include an input buffer 511 that may receive a write data strobe signal WDQS_T and an inversed signal of a complementary write data strobe signal WDQS_C. The IF chip 11 may include an input buffer 512 coupled to a deserializer (DES) write (W) FIFO 522 and an output buffer 513 coupled to a serializer (SER) read (R) FIFO 523 for a data queue DQ signal and a data mask/check bit signal DM_CB. The IF chip 11 may also include an input buffer 514 coupled to a DES WFIFO 524 and an output buffer 515 coupled to a SER RFIFO 525 for DBI signal. The IF chip 11 may also include an input buffer 516 coupled to a DES WFIFO 526 and an output buffer 517 coupled to a SER RFIFO 527 for a parity signal PAR. The DES WFIFOs 522, 524 and 526 may provide signals from the input buffers 512, 514 and 516, respectively, based on a WDQS signal from the input buffer 511. The memory device 50 may also include an output buffer 518 for a DERR signal coupled to a flip-flop (FF) 528 that may provide parity error information of data on the DQ signal. The memory device 50 may also include an output buffer 519 for a complementary pair of read data strobe signals RDQS_T/C. The memory device 50 may also include an input buffer 520 that may receive a clock signal CK_T and an inversed signal of a complementary clock signal CK_C and may further provide a lock signal to a clock (CLK) control circuit 530 that may provide clock signals to a clock (CLK) bus 541 via an inverter 540. The SER RFIFOs 523, 525, 527, and the FF 528 may receive the clock signal and may further provide signals based on the clock signal. The memory device 50 may further include an input buffer 521 that may receive a row/column command address signal R/C and may be coupled to a DES 531 that may provide row/column command address signals based on a clock signal received from the CLK control circuit 530.

The IF chip may include a parity computation circuit 533. On write operations, the parity computation circuit 533 computes parity information based on data received on DQ, DM_CB and DBI signals, compares the parity information with a corresponding serial-parallel converted PAR signal by the DES WFIFO 526 and provides data error DERR information whether a parity error has occurred to the FF 528. On read operations, the parity computation circuit 533 may generate parity information based on the data DQ, DM_CB and DBI signals to be transmitted and may further transmit the parity information as the PAR signal via the SER RFIFO 527 and the output buffer 517 along with the data on DQ and DBI signals.

The IF chip 11 may include a multiple-input signature register (MISR) and linear feedback shift register (LFSR) computation circuit 532 for testing and training a link (e.g., a link test) between the memory controller and the memory device 50. The IF chip 11 may include driver/receiver circuits 534 and 535. On write operations, the driver/receiver circuits 534 and 535 may drive the DQ and DBI signals from the memory controller and may further transmit the DQ and DBI signals to data buses 538 and 539, respectively. On read operations, the driver/receiver circuits 534 and 535 may receive the DQ and DBI signals from the core chip 12 via the data buses 538 and 539, respectively. The IF chip 11 may include inverters 536 and 537 that may drive the clock signal and the row/column command address signals by inversion and may further transmit the inverted clock signal and the inverted row/column command address signals through a clock (CLK) bus 540 and a command bus 541, respectively.

The core chip 12 may include driver/receiver circuits 542 and 543. On write operations, the driver/receiver circuits 542 and 543 may receive the DQ and DBI signals from the data buses 538 and 539, respectively. On read operations, the driver/receiver circuits 542 and 543 may receive the DQ and DBI signals from a DBI computation circuit 546 in the core chip 12 and may further transmit the DQ and DBI signals to the data buses 538 and 539, respectively. The core chip 12 may include inverters 544 and 545 that may receive the inverted clock signal and the inverted row/column command address signals and may further transmit the clock signal and the row/column command address signals to a clock control circuit 547 that provides a core clock signal. On write operations, the DBI computation circuit 546 may receive the DQ and DBI signals and may further decode the DQ signal based on the DBI signal and the core clock signal from the clock control circuit 547. On read operations, the DBI computation circuit 546 may receive the DQ and DBI signals from a memory array 552 via a main amplifier 551 and may further encode the DQ signal based on the DBI signal and the core clock signal from the clock control circuit 547.

Figure 6:
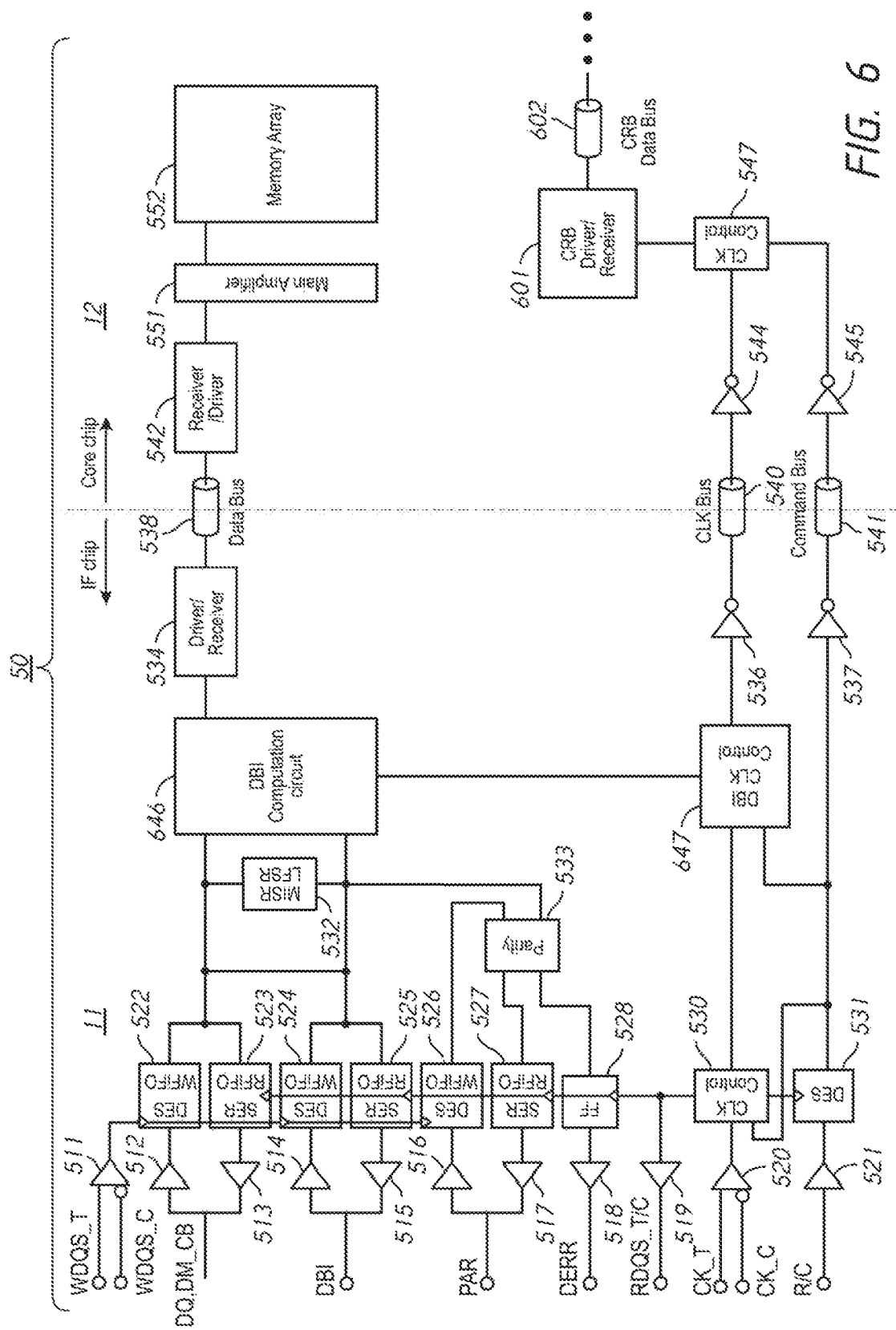
FIG. 6 is a block diagram of a memory device including a DBI computation circuit in accordance with an embodiment of the present disclosure.

FIG. 6 is a block diagram of a memory device including a DBI computation circuit in accordance with an embodiment of the present disclosure. Description of components corresponding to components in FIG. 5 will not be repeated and changes from FIG. 5 including additional components and positional relationships between the components will be described. In order to consider an outcome of the link test result from the MISR/LFSR computation circuit 532 into DBI computation, the DBI computation circuit may 646 in the IF chip 11 may be coupled between the MISR/LFSR computation circuit 532 and the driver/receiver circuit 534. On write operations, the DBI computation circuit 646 in the IF chip 11 may receive the DQ and DBI signals from the MISR/LFSR computation circuit 532 and may further decode the DQ signal based on the DBI signal and a DBI clock signal from a DBI clock control circuit 647. On read operations, the DBI computation circuit 646 in the IF chip 11 may receive the DQ signals from the driver/receiver circuit 534, respectively, and may further encode the DQ signal based on the DBI clock signal from the DBI clock control circuit 647.

In order to reduce power dissipation associated with data communication in the core chip 12, a charge recycling technique may be used. In the charge recycling technique, a plurality of bus lanes may be coupled in series between a positive supply voltage ($V_{DD}$) and a negative supply voltage ($V_{SS}$) (e.g., a ground potential) to use charge/discharge current generated during data transmission on a bus lane at a high voltage level for data transmission on a bus lane having a low voltage level. For example, a clock (CLK) control circuit 547 on the core chip 12 may be coupled to a charge recycling bus (CRB) driver/receiver circuit 601. The CRB driver/receiver circuit 601 may receive a core clock signal from the CLK control circuit 547. The CRB driver/receiver circuit 601 may transmit a data signal to a CRB data bus 602 in the core chip 12 or may receive a data signal from the CRB data bus 602, responsive to the core clock signal.

Figure 7:
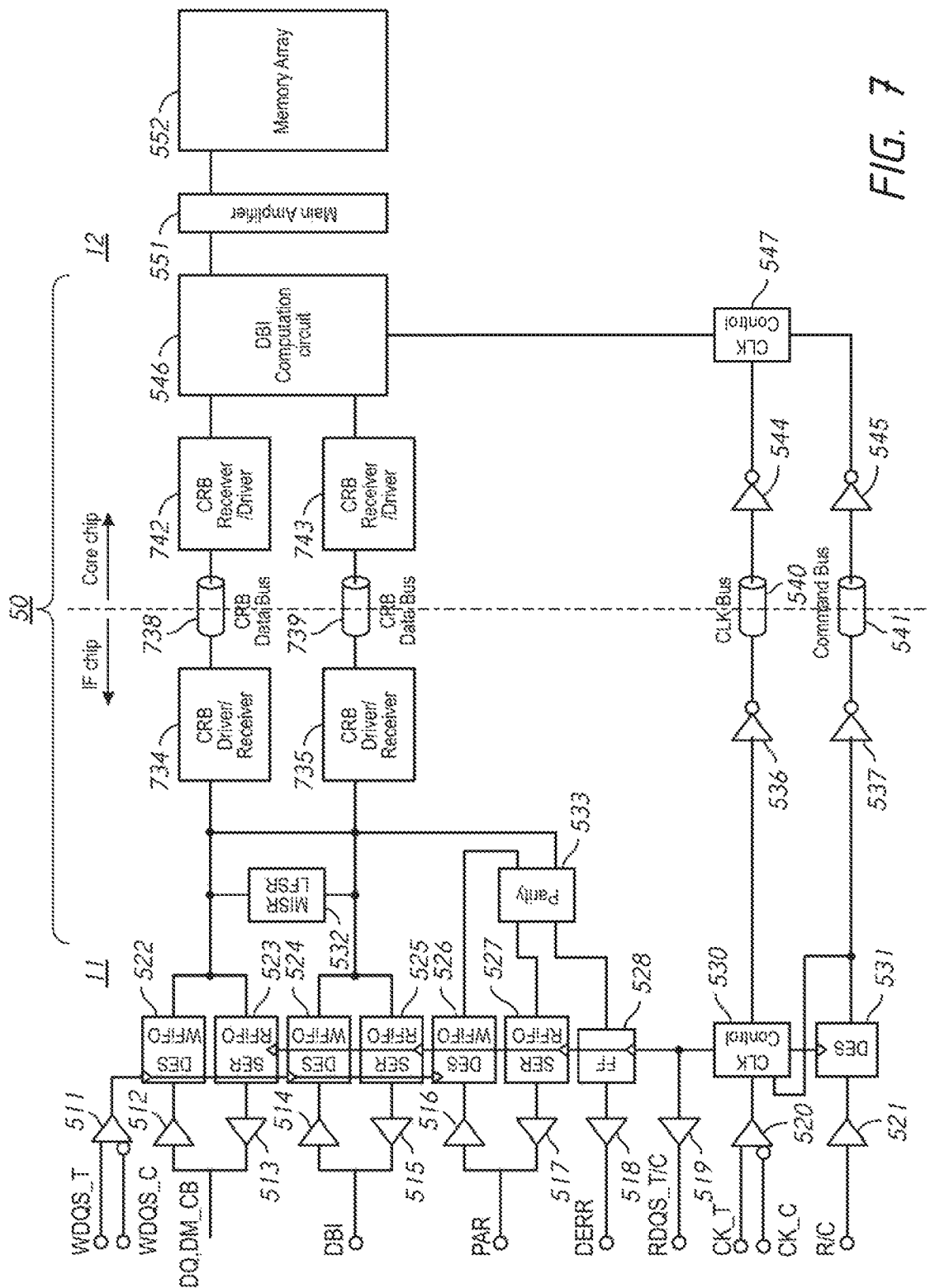
FIG. 7 is a block diagram of a memory device including a DBI computation circuit in accordance with an embodiment of the present disclosure.

FIG. 7 is a block diagram of a memory device including a DBI computation circuit in accordance with an embodiment of the present disclosure. Description of components corresponding to components in FIG. 5 will not be repeated and changes from FIG. 5 including additional components and positional relationships between the components will be described. The memory device 50 may include CRB data buses 738 and 739 for data transmission between the IF chip 11 and the core chip 12. The IF chip 11 may include CRB driver/receiver circuits 734 and 735. On write operations, the CRB driver/receiver circuits 734 and 735 may drive the DQ and DBI signals from the memory controller and may further transmit the DQ and DBI signals to the CRB data buses 738 and 739, respectively. On read operations, the CRB driver/receiver circuits 734 and 735 may receive the DQ and DBI signals from the core chip 12 via the CRB data buses 738 and 739, respectively. The core chip 12 may include CRB driver/receiver circuits 742 and 743. On write operations, the CRB driver/receiver circuits 742 and 743 may receive the DQ and DBI signals from the CRB data buses 738 and 739, respectively. On read operations, the CRB driver/receiver circuits 742 and 743 may receive the DQ and DBI signals from the DBI computation circuit 546 in the core chip 12 and may further transmit the DQ and DBI signals to the CRB data buses 738 and 739, respectively.

Figure 8:
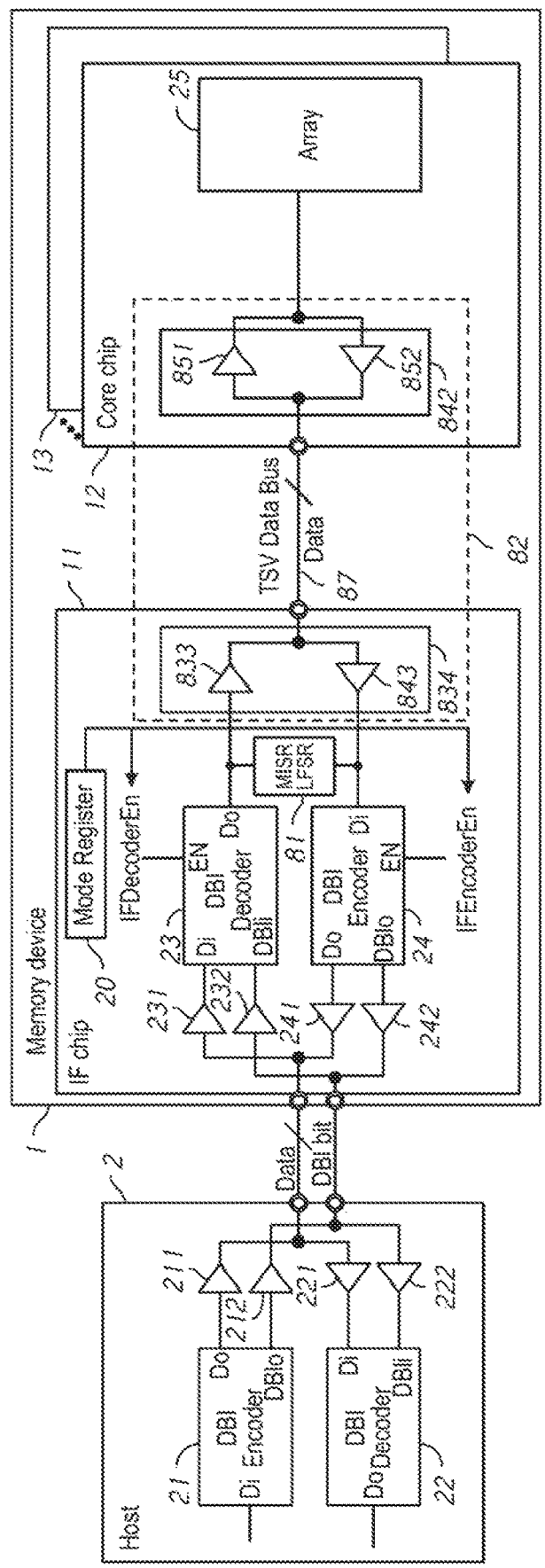
FIG. 8 is a block diagram of a host device and a memory device including an IF chip and a core chip in the semiconductor device in accordance with an embodiment of the present disclosure.

FIG. 8 is a block diagram of a host device 2 and a memory device 1 including an IF chip 11 and a core chip 12 in the semiconductor device in accordance with an embodiment of the present disclosure. Description of components corresponding to the host device 2 in FIG. 2A will not be repeated and changes from FIG. 2A including positional relationships between the components will be described. The IF chip 11 may further include an MISR/LFSR computation circuit 81 for a linking test of the host device 2 and the memory device 1. Because of executing MISR/LFSR computation after DBI decoding by the DBI decoder 23 on write operations or before DBI encoding by the DBI encoder 24 in read operations, communications between the IF chip 11 and the core chip 13 may employ the charge recycling technique for power dissipation. The MISR/LFSR computation circuit 81 may be coupled to a Do node of the DBI decoder 23 and a Di node of the DBI encoder 24. The memory device 1 may include a CRB block 82 between the IF chip 11 and the core chip 12 (and the core chip 13). The CRB block 82 may include a CRB driver/receiver 834 coupled to the MISR/LFSR computation circuit 81, a TSV data bus 87 (e.g., a CRB data bus), and a CRB driver/receiver 842 that may be coupled to the array 25. The CRB driver/receiver 834 in the IF chip 11 may include an output buffer 833 and an input buffer 843. The CRB driver/receiver 842 in the core chip 12 may include an input buffer 851 and an output buffer 842. On writing operations, output signals from the MISR/LFSR computation circuit 81 may be provided to an array 25 via the output buffer 833, the TSV data bus 87, and the input buffer 851. On reading operations, output signals from the array 25 may be provided to the MISR/LFSR computation circuit 81 via the output buffer 852, the TSV data bus 87 and the input buffer 843.

Figure 9:
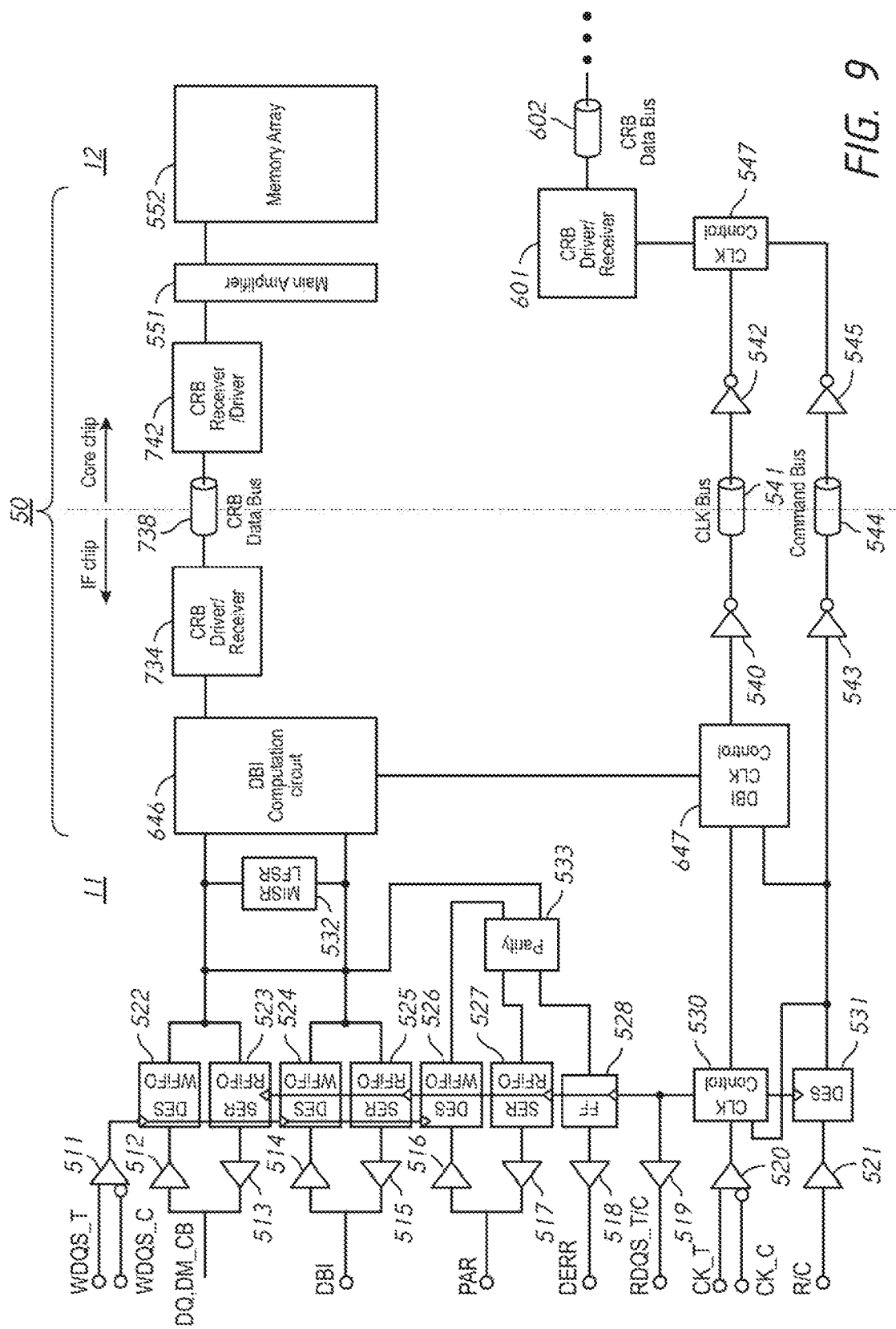
FIG. 9 is a block diagram of a memory device including a DBI computation circuit in accordance with an embodiment of the present disclosure.

FIG. 9 is a block diagram of a memory device including a DBI computation circuit in accordance with an embodiment of the present disclosure. Description of components corresponding to components in FIGS. 5 to 7 will not be repeated. In order to consider an outcome of the link test result from the MISR/LFSR computation circuit 532 into DBI computation, a DBI computation circuit 646 in the IF chip may be coupled between the MISR/LFSR computation circuit 532 and a CRB driver/receiver circuit 734. On write operations, the DBI computation circuit 646 in the IF chip 11 may receive the DQ and DBI signals from the MISR/LFSR computation circuit 532 and may further decode the DQ signal based on the DBI signal and a DBI clock signal from a DBI clock control circuit 647. On read operations, the DBI computation circuit 646 in the IF chip 11 may receive the DQ signals from the driver/receiver circuit 734, respectively, and may further encode the DQ signal based on the DBI clock signal from the DBI clock control circuit 647.

The memory device 50 may include a CRB data bus 738 for data transmission between the IF chip 11 and the core chip 12. The IF chip 11 may include a CRB driver/receiver circuit 734. On write operations, the CRB driver/receiver circuit 734 may drive the DQ signals from the DBI computation circuit 646 and may further transmit the DQ signals to the CRB data bus 738. On read operations, the CRB driver/receiver circuits 734 may receive the DQ signals from the core chip 12 via the CRB data bus 738. The core chip 12 may include a CRB driver/receiver circuit 742. On write operations, the CRB driver/receiver circuit 742 may receive the DQ signals from the CRB data bus 738. On read operations, the CRB driver/receiver circuit 742 may receive the DQ signals from a memory array 552 via a main amplifier 551 in the core chip 12 and may further transmit the DQ signals to the CRB data bus 738. The core chip 12 may further include a clock (CLK) control circuit 547 that may be coupled to a charge recycling bus (CRB) driver/receiver circuit 601. The CRB driver/receiver circuit 601 may receive a core clock signal from the CLK control circuit 547. The CRB driver/receiver circuit 601 may transmit a data signal to a CRB data bus 602 in the core chip 12 or may receive a data signal from the CRB data bus 602, responsive to the core clock signal.

Logic levels of signals used in the embodiments described the above are merely examples. However, in other embodiments, combinations of the logic levels of signals other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising first and second semiconductor chips that are stacked with each other via through substrate vias (TSVs) provided in at least one of the first and second semiconductor chips, the first and second semiconductor chips being configured to communicate with each other by use of data bus inversion (DBI) data that have been encoded using a DBI algorithm;
    wherein the first semiconductor chip is configured to:
        receive input data from a controller external to the first and second semiconductor chips; and
        responsive to a DBI enable signal:
            encode the input data using the DBI algorithm and provide encoded input data to the second semiconductor chip; or
            pass through the input data provided by the controller to the second semiconductor chip,
    wherein the second semiconductor chip comprises a memory cell army, and
    wherein the first semiconductor chip comprises a first DBI computation circuit configured to receive first DBI data from a controller, to decode the first DBI data with the DBI algorithm, and further configured to provide the decoded first DBI data to the second semiconductor memory chip, and
    wherein the first DBI computation circuit is further configured to receive cell data from the second semiconductor chip, to encode the cell data into second DBI data with the DBI algorithm, and further configured to transmit the second DBI data to the controller.

2. An apparatus comprising:
    first and second semiconductor chips that are stacked with each other via through substrate vias (TSVs) provided in at least one of the first and second semiconductor chips, the first and second semiconductor chips being configured to communicate with each other by use of data bus inversion (DBI) data that have been encoded using a DBI algorithm;

wherein the first semiconductor chip comprises:

a first DBI computation circuit configured to receive first DBI data from a controller, to decode the first DBI data with the DBI algorithm, and further configured to provide the decoded first DBI data to the second semiconductor memory chip;

wherein the first DBI computation circuit is further configured to receive cell data from the second semiconductor chip, to encode the cell data into second DBI data with the DBI algorithm, and further configured to transmit the second DBI data to the controller;

a plurality of first input terminals configured to receive first input data from the controller;

a plurality of first output terminals coupled to a first portion of the TSVs and configured to transmit first output data via the first portion of the TSVs;

a plurality of second input terminals coupled to a second portion of the TSVs and configured to receive second input data from the second portion of the TSVs; and a plurality of second output terminals configured to provide second output data to the controller; and wherein the second semiconductor chip comprises a memory cell array.

3. The semiconductor device of claim 2, wherein the plurality of first input terminals and the plurality of second output terminals are formed on a first main surface of the first semiconductor chip and a first output buffer and a second input buffer are formed on a second main surface of the first semiconductor chip, and wherein the second main surface is opposite to the first main surface.

4. The apparatus of claim 1, wherein the first semiconductor chip further comprises a first input buffer configured to receive a first input data from the controller; and a first output buffer configured to provide a first output data to the second semiconductor chip;

wherein the first DBI computation circuit comprises:

a DBI decoder coupled between the first input buffer and the first output buffer and supplied with a second DBI enable signal, the DBI decoder being configured to:

enable a DBI decoding operation on the first input data as the first DBI data to generate and provide the decoded first DBI data as first output data to the first output buffer when the second DBI enable signal indicates a first state; and disable the DII decoding operation on the first input data to generate and provide the first input data as the first output data to the first output buffer when the second DBI enable signal indicates a second state.

5. The apparatus of claim 4, wherein the first semiconductor chip further comprises:

a second input buffer configured to receive second input data from the second semiconductor chip; and a second output buffer configured to provide second output data to the controller;

wherein the first DBI computation circuit further comprises:

a DBI encoder coupled between the second input buffer and the second output buffer and supplied with a third DBI enable signal, the DI encoder being configured to:

enable a DBI encoding operation on the second input data to generate and provide the encoded second input data as the second output data to the second output buffer when the third DBI enable signal indicates a third state; and disable the DBI encoding operation on the second input data to generate and provide the encoded second input data as the second output data to the second output buffer when the third DBI enable signal indicates a fourth state.

6. The apparatus of claim 1, wherein the second semiconductor chip comprises a memory cell array and a first DI computation circuit coupled to the memory cell array, wherein the first DBI computation circuit is configured to receive first DBI data from the first semiconductor chip, to decode the first DBI data with the DBI algorithm, and further configured to provide the decoded first DBI data to the memory cell array, and wherein the first DBI computation circuit is further configured to receive cell data from the memory cell array, to encode the cell data into second DBI data with the DBI algorithm, and further configured to transmit the second DBI data to the first semiconductor chip.

7. The apparatus of claim 6, wherein the first semiconductor chip is configured to pass through the first DBI data and the second DBI data.

8. An apparatus comprising:

first and second semiconductor chips that are stacked with each other via through substrate vias (TSVs) provided in at least one of the first and second semiconductor chips, the first and second semiconductor chips being configured to communicate with each other by use of data bus inversion (DBI) data that have been encoded using a DBI algorithm;

wherein the second semiconductor chip further comprises:

a memory cell array and a first DBI computation circuit coupled to the memory cell array, the first DBI computation circuit configured to:

receive first DBI data from the first semiconductor chip, to decode the first DBI data with the DBI algorithm, and further configured to provide the decoded first DBI data to the memory cell array, and receive cell data from the memory cell array, to encode the cell data into second DI data with the DBI algorithm, and further configured to transmit the second DBI data to the first semiconductor chip;

a first input buffer coupled to a first portion of the TSVs and configured to receive first input data from the first semiconductor chip; and a first output buffer coupled to the memory cell array and configured to provide first output data to the memory cell array;

wherein the first DBI computation circuit comprises:

a DBI decoder coupled between the first input buffer and the first output buffer and supplied with a first DBI enable signal, the DBI decoder being configured to:

enable a DBI decoding operation on the first input data as the first DBI data to generate and provide the decoded first DBI data as first output data to the first output buffer when the first DBI enable signal indicates a first state; and disable the DBI decoding operation on the first input data to generate and provide the first input data as the first output data to the first output buffer when the first DBI enable signal indicates a second state; and wherein the first semiconductor chip is configured to pass through the first DBI data and the second DBI data.

9. The apparatus of claim 8, wherein the second semiconductor chip further comprises:
a second input buffer coupled to the memory cell array and configured to receive second input data from the memory cell array; and
a second output buffer coupled to a second portion of the TSVs and configured to provide second output data to the first semiconductor chip;
wherein the first DBI computation circuit comprises:
a DBI encoder coupled between the second input buffer and the second output buffer and supplied with a second DBI enable signal, the DBI encoder being configured to:
enable a DBI encoding operation on the second input data as the second DBI data to generate and provide the encoded second DBI data as second output data to the second output buffer when the second DBI enable signal indicates a third state; and
disable the DBI encoding operation on the second input data to generate and provide the second input data as the second output data to the second output buffer when the second DBI enable signal indicates a fourth state.

10. A semiconductor device comprising:
a plurality of input terminals configured to receive input data from a controller external to the semiconductor device;
a plurality of output terminals;
a first terminal configured to receive a first signal associated with the input data provided by the controller;
a second terminal; and
a data bus inversion (DBI) encoder coupled between the plurality of input terminals and the plurality of output terminals and supplied with a DBI enable signal, the DBI encoder being configured to:
enable a DBI encoding operation on the input data to generate and provide first output data to the plurality of output terminals when the DBI enable signal indicates a first state;
generate a second signal associated with the first output data when the DBI enable signal indicates the first state; and
disable the DBI encoding operation on the input data to generate and provide second output data to the plurality of output terminals when the DBI enable signal indicates a second state; and
a selector circuit coupled to the first terminal, the second terminal and the DBI encoder, the selector circuit being configured to provide the second terminal with first signal when the DBI enable signal indicates the second state and with the second signal when the DBI enable signal indicates the first state.

11. The semiconductor device of claim 10, wherein the plurality of input terminals and the plurality of output terminals are formed on a first main surface of the semiconductor device and a second main surface of the semiconductor device, respectively, and the second main surface is opposite to the first main surface.

12. The semiconductor device of claim 10, wherein the first state is an enable state and the second state is a disable state.

13. A system comprising:
a controller configured to provide at least one of first and second data, the first data being encoded using a data bus inversion (DBI) algorithm and the second data being not encoded using the DBI algorithm;
a first chip coupled to the controller;
a second chip coupled to the first chip; and
a data bus coupled between the first chip and the second chip, the data bus configured to transmit data from the first chip to the second chip,
wherein the first chip is configured to:
responsive to an active first DBI enable signal, pass through the first data to the second chip when the controller provides the first data;
responsive to an inactive first DBI enable signal, encode the second data provided by the controller using the DBI algorithm, and provide the encoded second data to the second chip,
wherein the data bus is configured to transmit a DBI bit indicative of whether the data on the data bus is inverted from the second data,
wherein the second chip comprises a memory cell array and a first DBI computation circuit coupled to the data bus, and
wherein the first DBI computation circuit is configured to receive the data from the data bus, to decode the data with the DBI algorithm responsive to the DBI bit, and further configured to provide the memory cell array with the decoded data.

14. The apparatus of claim 13, wherein the first DBI computation circuit comprises a DBI decoder supplied with a second DBI enable signal, the DBI decoder being configured to:
enable a DBI decoding operation on the data to generate and provide the decoded data to the memory cell array when the second DBI enable signal indicates a first state; and
disable the DBI decoding operation on the data to generate and provide the data to the memory cell array when the second DBI enable signal indicates a second state.

15. The apparatus of claim 14, wherein the first DBI computation circuit further comprises a DBI encoder supplied with a third DBI enable signal, the DBI encoder being configured to:
enable a DBI encoding operation on data read from the memory cell array to generate and provide read DBI data to the first chip via the data bus when the third DBI enable signal indicates a third state; and
disable the DBI encoding operation on data read from the memory cell array to generate and provide the read data to the first chip via the data bus when the third DBI enable signal indicates a fourth state.

16. A system comprising:
a controller configured to provide at least one of first and second data, the first data being encoded using a DBI algorithm and the second data being not encoded using the DBI algorithm;
a first chip coupled to the controller;
a second chip coupled to the first chip, the second chip comprising a memory cell array and a first DBI computation circuit;
a data bus coupled between the first chip and the second chip, the data bus further coupled to the first DBI computation circuit and configured to transmit data from the first chip to the second chip;

wherein the first chip is configured to:
  pass through the first data to the second chip when the controller provides the first data;
  convert the second data to third data that is encoded using the DBI algorithm when the controller provides the second data; and
  provide the third data to the second chip; and
wherein the data bus is configured to transmit a DBI bit indicative of whether the data on the data bus is inverted from the second data;
wherein the first DBI computation circuit is configured to receive the data from the data bus, to decode the data with the DBI algorithm responsive to the DBI bit, and further configured to provide the memory cell array with either the received input data or the decoded input data; and
wherein, if the data bus is configured to provide data without a DBI bit indicative of whether the first chip is providing either the first data or the third data inverted from an original data between the controller and the second chip, the first chip is further configured to:
  pass through the second data to the second chip responsive to the second data received from the controller;
  convert the first data to third data that is decoded using the DBI algorithm responsive to the first data received from the controller; and
  provide the third data to the second chip.

17. The apparatus of claim 13, wherein the first chip comprises a first DBI computation circuit configured to receive the first data from the controller, to decode the first data with the DBI algorithm, and further configured to provide the decoded first data to the second chip, and
  wherein the first DBI computation circuit is further configured to receive cell data from the second chip, to encode the cell data with the DBI algorithm, and further configured to transmit the encoded cell data to the controller.

18. An apparatus comprising:
a controller configured to provide at least one of first and second data, the first data being encoded using a DBI algorithm and the second data being not encoded using the DBI algorithm;
a first chip coupled to the controller, the first chip comprising a first DBI computation circuit configured to:
  receive the second data from the controller, to decode the second data to the third data, and further configured to provide the third data to the second chip;
  receive cell data from the second chip, to encode the cell data into fourth data with the DBI algorithm; and
  transmit the fourth data to the controller;
a second chip coupled to the first chip; and
a data bus coupled between the first chip and the second chip, the data bus configured to transmit data from the first chip to the second chip,
wherein the first chip is configured to:
  pass through the first data to the second chip when the controller provides the first data;
  convert the second data to third data that is encoded using the DBI algorithm when the controller provides the second data; and
  provide the third data to the second chip; and
wherein the first DBI computation circuit comprises a DBI encoder supplied with a DBI enable signal, the DBI encoder being configured to:
  enable a DBI decoding operation on the second data to generate and provide the third data when the DBI enable signal indicates a first state; and
  disable the DBI decoding operation on the first data, and further configured to provide the first data to the second chip when the first DBI enable signal indicates a second state.

* * * * *

UNITED STATES PATENT AND TRADEMARK OFFICE
CERTIFICATE OF CORRECTION

PATENT NO. : 11,120,849 B2  
APPLICATION NO. : 16/459439  
DATED : September 14, 2021  
INVENTOR(S) : Kondo et al.

Page 1 of 1

It is certified that error appears in the above-identified patent and that said Letters Patent is hereby corrected as shown below:

In the Claims

| | DELETE | INSERT |
|---|---|---|
| Column 12, Line 53 Claim 1 | "memory cell army" | -- memory cell array -- |
| Column 13, Line 52 Claim 4 | "the DII decoding operation" | -- the DBI decoding operation -- |
| Column 13, Line 67 Claim 5 | "the DI encoder" | -- the DBI encoder -- |
| Column 14, Line 12 Claim 6 | "first DI computation circuit" | -- first DBI computation circuit -- |
| Column 14, Line 46 Claim 8 | "second DI data" | -- second DBI data -- |

Signed and Sealed this  
Ninth Day of November, 2021

Drew Hirshfeld  
*Performing the Functions and Duties of the*  
*Under Secretary of Commerce for Intellectual Property and*  
*Director of the United States Patent and Trademark Office*